United States Patent
Kawakami et al.

(10) Patent No.: US 7,924,609 B2
(45) Date of Patent: Apr. 12, 2011

(54) SPIN VALVE ELEMENT DRIVING METHOD AND SPIN VALVE ELEMENT

(75) Inventors: Haruo Kawakami, Miura (JP); Yasushi Ogimoto, Higashiyamato (JP)

(73) Assignee: Fuji Electric Holdings Co., Ltd., Kawasaki-Shi (JP)

(*) Notice: Subject to any disclaimer, the term of this patent is extended or adjusted under 35 U.S.C. 154(b) by 0 days.

(21) Appl. No.: 12/809,550

(22) PCT Filed: Aug. 28, 2008

(86) PCT No.: PCT/JP2008/065409
§ 371 (c)(1),
(2), (4) Date: Aug. 17, 2010

(87) PCT Pub. No.: WO2009/078201
PCT Pub. Date: Jun. 25, 2009

(65) Prior Publication Data
US 2010/0308946 A1    Dec. 9, 2010

(30) Foreign Application Priority Data
Dec. 19, 2007    (JP) .................................. 2007-327174

(51) Int. Cl.
*G11C 11/14* (2006.01)
(52) U.S. Cl. ........ 365/171; 365/158; 365/170; 365/173; 365/172
(58) Field of Classification Search .................. 365/158, 365/171, 173, 170
See application file for complete search history.

(56) References Cited

U.S. PATENT DOCUMENTS
6,483,741 B1    11/2002    Iwasaki et al.
2005/0034017 A1*    2/2005    Airaud et al. .................... 714/25
2005/0219771 A1*    10/2005    Sato et al. ................. 360/324.2

FOREIGN PATENT DOCUMENTS
JP    2001-084756 A    3/2001
JP    2007-124340 A    5/2007
WO    WO-2006-101040 A1    9/2006

OTHER PUBLICATIONS

Yoshishige Suzuki et al., "Microwave Properties of Spin Injection Device—Spontaneous Oscillation, Spin-Torque Diode Effect and Magnetic Noise", Magnetics Japan, Jun. 1, 2007, vol. 2, No. 6, pp. 282 to 290. Cited in Intl Search Report.

* cited by examiner

*Primary Examiner* — Hoai V Ho
*Assistant Examiner* — Fernando N Hidalgo
(74) *Attorney, Agent, or Firm* — Rabin & Berdo, P.C.

(57) ABSTRACT

A spin valve element driving method, and a spin valve element employing such a method, for causing microwave oscillation in a spin valve element. The spin valve element includes an intermediate layer and a pair of ferromagnetic layers including a fixed layer and a free layer sandwiching the intermediate layer, the fixed layer having a higher coercivity than the free layer, and being magnetized in a direction substantially perpendicular to a film plane thereof. The method includes a driving step of passing current from one of the pair of ferromagnetic layers to the other through the intermediate layer.

11 Claims, 8 Drawing Sheets

SPIN VALVE ELEMENT DRIVING METHOD AND SPIN VALVE ELEMENT

TECHNICAL FIELD

This invention relates to a method of driving a spin valve element employing the tunneling magnetoresistance (TMR) effect or the giant magnetoresistance (GMR) effect, and to a spin valve element, and in particular relates to a driving method and element for obtaining electromagnetic signals by driving in use of current.

BACKGROUND ART

With recent advances in nanoelectronics, products are being developed which apply physical phenomena unique to magnetic materials with minute sizes.

Of these, there have been particularly rapid advances in the field of spin electronics, which utilise the spin of free electrons in magnetic materials.

Figure 10:
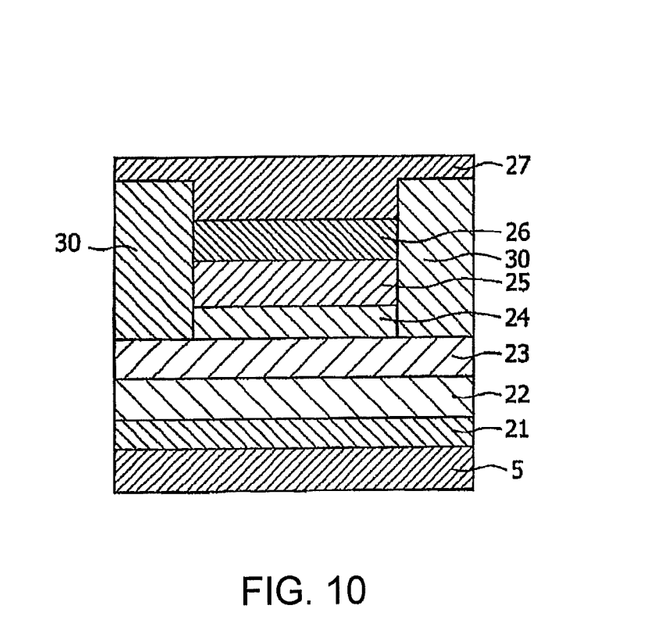
FIG. 10 is a cross-sectional view showing the basic constituent components of a spin valve element utilizing TMR.
Figure 11:
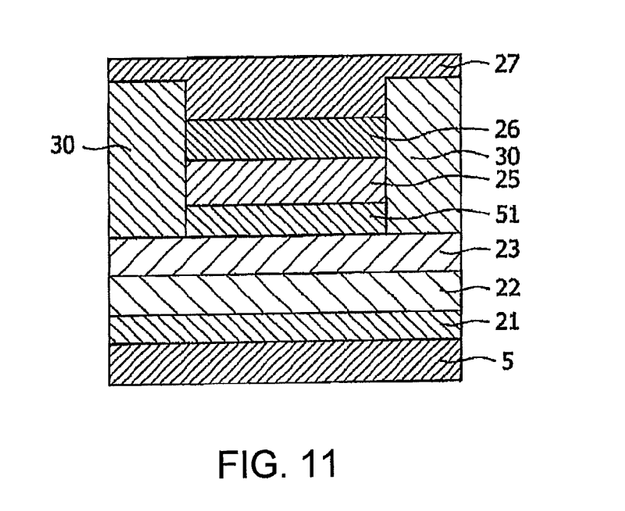
FIG. 11 is a cross-sectional view showing the basic constituent components of a spin valve element utilizing GMR.

In the field of spin electronics, spin valve elements utilizing the tunneling magnetoresistance (TMR) effect occurring in a layered structure of a ferromagnetic layer, an insulating layer, and a ferromagnetic layer in order, or utilizing the giant magnetoresistance (GMR) effect occurring in a layered structure of a ferromagnetic layer, nonmagnetic layer (conducting layer), and a ferromagnetic layer in order, are currently regarded as having the greatest possibility of application. FIG. 10 and FIG. 11 show examples of the configuration of spin valve elements of the prior art. Of these, FIG. 10 shows the basic constituent portions of a spin valve element utilizing TMR. This spin valve element has a single insulating layer 24, a pair of a ferromagnetic layer 23 (fixed layer) and a ferromagnetic layer 25 (free layer) sandwiching the insulating layer between them, and electrode layers 21, 27, formed on a substrate 5; to this are further added, as necessary, an antiferromagnetic layer (pinning layer) 22, a capping layer 26, and similar. The magnetization of the fixed layer 23 is fixed by a magnetic coupling with the antiferromagnetic layer 22 and similar. When electrons are passed from the fixed layer 23 to the free layer 25 in this element, a torque acts to cause the spin (the magnetization or magnetic moment) of the free layer 25 to be aligned parallel to the magnetization direction of the fixed layer 23. Conversely, when electrons are passed from the free layer 25 toward the fixed layer 23, a torque acts on the spin of the free layer 25 so as to be antiparallel to the fixed layer 23. Through these actions, the direction of magnetization of the free layer 25 can be controlled by the direction of current. This effect is called spin transfer magnetization reversal. In FIG. 10, an insulating layer 30 is further provided, by means of which the element size is set to a size at which a single magnetic domain is obtained. FIG. 11 shows the basic constituent portions of a spin valve element utilizing GMR. In this case, a difference with an element utilizing TMR in FIG. 10 is that the insulating layer 24 is replaced with a nonmagnetic conducting layer 51; otherwise the functions are basically the same. By utilising these technologies, magnetic random access memory (MRAM) is possible, and so these technologies are attracting the most attention. This MRAM is anticipated as a replacement for conventional DRAM (Dynamic Random Access Memory) and SRAM (Static Random Access Memory).

Further, it is known that when an electric current and an external magnetic field are simultaneously applied to these spin valve elements, microwave oscillation is obtained (see, for example, Y. Suzuki et al, "High-frequency characteristics of spin-transfer elements: oscillation/diode effects and magnetic noise", Magne, Magn. Soc. Jpn., 2007, Vol. 2 No. 6, p. 282). That is, when for example the current direction is such that a torque acts on the magnetization of the free layer 25 so as to become antiparallel to the magnetization direction of the fixed layer 23, and the external magnetic field is made such that the magnetization of the free layer 25 becomes parallel to the magnetization direction of the fixed layer 23, then under conditions in which the two torques are counterbalanced, high-frequency electromagnetic signals are obtained.

In particular, when the magnetization directions of the fixed layer and the free layer are perpendicular to the film plane, that is, when the magnetocrystalline anisotropy field arising from the crystal anisotropy of the free layer material, the demagnetizing field depending on the film shape, the external magnetic field, and the injected spin are all perpendicular to the plane of the film of the free layer, then the oscillation mechanism is as follows (see id.).

First, in order to describe the state of the physical system in question, the following basic equation, which adds a spin injection term to the Landau-Lifshitz-Gilbert equation, is used. Hereinafter, m and H each represents a vector.

$$dm_2/dt = \gamma m_2 \times H_{eff} - \alpha m_2 \times dm_2/dt + \beta_{ST}(\theta) I m_2 \times (m_2 \times m_1) \quad (14)$$

$$\beta_{ST}(\theta) = g(\theta)\mu/(M_s \times V \times e) \quad (15)$$

Here $m_1$ and $m_2$ are unit vectors indicating the directions of magnetization in the fixed layer and in the free layer respectively; $\gamma$ is the gyromagnetic ratio; $H_{eff}$ is the effective magnetic field; $\alpha$ is the Gilbert damping constant; I is the current; $\theta$ is the angle made by the vectors $m_1$ and $m_2$; $\mu$ is the Bohr magneton; $M_s$ is the saturation magnetization of the free layer; V is the volume of the free layer; and e is the electronic charge. The angle $\theta$ (the angle made by $m_1$ and $m_2$) is a polar angle from the z axis direction, when using a polar coordinate representation in which the film plane is taken to be the xy plane and the direction perpendicular to the film plane is the z direction. Also, the symbol "x" appearing between two vectors indicates the outer product of vectors. In equation (15), the third term in the right side expresses the torque of spin injection (spin transfer torque).

By definition, $\theta = 0$ indicates that the magnetizations of the fixed layer and free layer are parallel, and $\theta = \pi$ indicates that the two are antiparallel. Also, $g(\theta)$ is a function of $\theta$ and the spin polarization P, and is represented by the following equations.

$$g(\theta) = 1/[-4 + (P^{1/2} + P^{-1/2})^3 (3 + \cos\theta)/4] \text{ (for GMR)} \quad (16)$$

$$g(\theta) = P/(1 + P^2 \cos\theta) \text{ (for TMR)} \quad (17)$$

From these equations, the entire free layer is approximated by a single spin for a case in which the effective magnetic field of the free layer and the injected spin are both perpendicular to the film plane, and the current and magnetic field oscillation conditions are determined.

Figure 12:
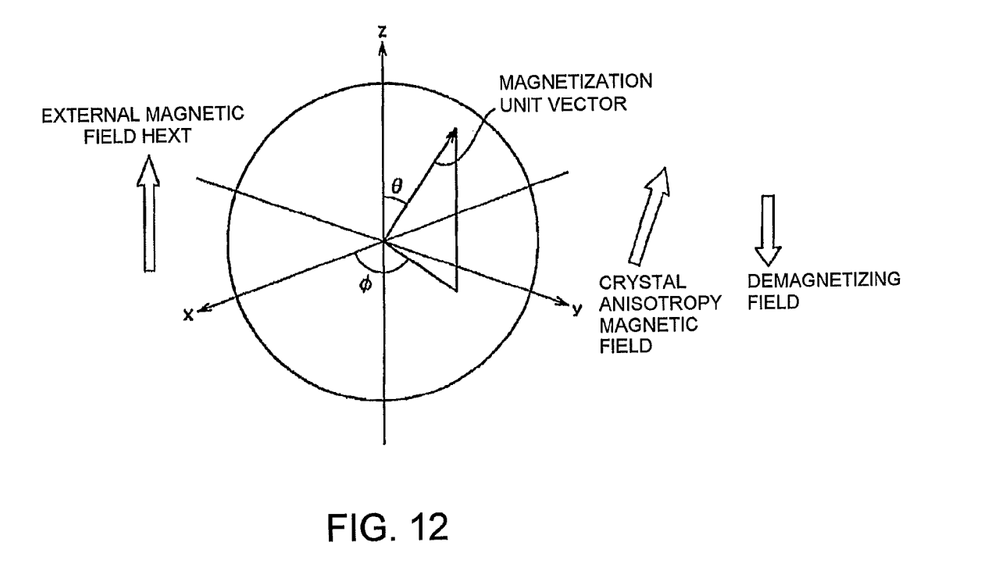
FIG. 12 is an explanatory diagram showing a magnetization vector and magnetic field direction in polar coordinates.

Taking the direction of the magnetization in the fixed layer to be the z axis and the film plane to be the xy plane, as in FIG. 12, and expressing equation (14) in polar coordinates, the following are obtained.

$$dm_2/dt = T_\theta e_\theta + T_\phi e_\phi \quad (18)$$

$$T_\phi = \gamma(H_{eff} \cdot e_\theta) \quad (19)$$

$$T_\theta = -\alpha_{eff} T_\phi \quad (20)$$

$$\alpha_{eff} = \alpha - \beta_{ST}(\theta) I (\sin(\theta)/\gamma(H_{eff} \cdot e_\theta)) \quad (21)$$

Further, $T_\theta$ and $T_\phi$ are respectively the polar angle $\theta$ and azimuth angle $\phi$ components of the torque acting on the vector $m_2$ in addition to the magnetization moment of the free layer. Also, $e_\theta$ and $e_\phi$, are respectively unit vectors in the direction of motion of the radius vector when one of the polar angle $\theta$ and the azimuth angle $\phi$ is fixed and the other is increased. Also, ($\cdot$) denotes a inner product of vectors. The effective magnetic field $H_{eff}$ is expressed by the following equation.

$$H_{eff} = H_{ext} + Hu \cos \theta \quad (22)$$

Here $H_{ext}$ is the external magnetic field, and Hu is the uniaxial (magnetic) anisotropy field, which is the sum of the magnetocrystalline anisotropy field and the demagnetizing field; both directions are perpendicular to the film plane (the z axis direction in FIG. 12). From this, the following is obtained.

$$T_\theta = -\alpha\gamma Hu_z \sin \theta \cos \theta - \alpha\gamma H_{extz} \sin \theta + \beta_{ST}(\theta) I \sin(\theta) \quad (23)$$

Here $Hu_z$ and $H_{extz}$ are respectively the z axis components of the vectors Hu and $H_{ext}$. The conditions for a spin valve element to oscillate are that the torque $T_\theta$ in the $\theta$ direction simultaneously satisfy the conditions of the following two equations.

$$T_\theta = 0 \quad (24)$$

$$dT_\theta/d\theta < 0 \quad (25)$$

That is, if equation (25) is satisfied in the vicinity of $\theta=\theta_0$ which satisfies equation (24), $\theta=\theta_0$ is an energy minimum, and the spin of the free layer then undergoes a stable precessional motion.

As a method of obtaining electromagnetic signals from a magnetization precessional motion, for example, a method is known in which a spin valve element comprising a free layer (first free layer), an insulating layer, and a fixed layer (first fixed layer) is provided with a spin valve element for detection. This spin valve element for detection has, layered together, a ferromagnetic layer (second free layer) in proximity to the first free layer, having an in-plane magnetization which is exchange-coupled with the first free layer; an insulating layer; and, a ferromagnetic layer (second fixed layer), the magnetization of which is fixed in an in-plane direction. By this means, the magnetization in the first free layer which rotates due to the precessional motion causes a rotation of the magnetization in the second free layer, and the magnetoresistance of the spin valve layer for detection arising from the relative angle between this rotating magnetization and the magnetization of the second fixed layer changes periodically, so that an electromagnetic signal equivalent to the period of the precessional motion is obtained.

As explained above, in order to obtain microwave oscillation from these spin valve elements, a DC current and a DC external magnetic field must be simultaneously applied to the spin valve element. Of these, an electromagnet comprising a coil and iron core, a permanent magnet, or similar is necessary to apply the external magnetic field. If ancillary components are included when using such magnets, then components with large volume compared with the spin valve element itself, which normally has dimensions on the order of tens of nanometers, become necessary, and the stronger the external field applied, the larger these must be. Further, electric power is necessary to generate a magnetic field using a current in an electromagnet or similar, and the means for supplying the power also occupies a large volume, power consumption is increased, and larger means are necessary in proportion to the strength of the magnetic field generated. Hence application of a strong magnetic field as the external magnetic field, and use of an external magnetic field itself, are substantial hindrances to efforts to miniaturize the entire element. Thus a driving method of obtaining microwave oscillation from a spin valve element using as weak an external magnetic field as possible, or without using a magnetic field at all, is sought.

Further, there is a problem that the initial state of a spin valve element cannot be identified at the time of element manufacture. For example, when a constant spin transfer current is passed through numerous spin valve elements, elements from which microwave oscillation is obtained and elements from which microwave oscillation is not obtained are intermixed, and there is the problem that characteristics are not constant.

In this way, means have been sought for identifying the initial state of a spin valve element when performing current driving of the spin valve element, and also for stabilising the microwave oscillation characteristics of the spin valve element.

This invention was devised in light of the above circumstances, and has as an object the resolution of at least one among the problems of driving a spin valve element using a weak external magnetic field, or using no external magnetic field at all, to cause microwave oscillation; of obtaining such a spin valve element; and of executing control to enable or disable oscillation of a spin valve element.

DISCLOSURE OF THE INVENTION

This invention relates to a spin valve element driving method. That is, a spin valve element driving method is provided that obtains an electromagnetic signal from a spin valve element, which includes an intermediate layer that is an insulating layer or a nonmagnetic (conducting) layer, and a pair of ferromagnetic layers sandwiching the intermediate layer. Coercivities in each of the layers of the pair of ferromagnetic layers are different from each other. A fixed layer, which is the ferromagnetic layer having a higher coercivity among the pair of ferromagnetic layers, is magnetized in a direction substantially perpendicular to a film plane of the fixed layer.

The method includes a driving step of passing current from one of the pair of ferromagnetic layers to the other one of the pair of ferromagnetic layers through the intermediate layer. In the driving step, a set of values including the value X of the current passed in the spin valve element and the value Y of an external magnetic field is made a set which satisfies both $$\text{a first condition: } (A+BYD)^2 - 4AD(BY-CX) > 0 \quad (1)$$

and $$\text{a second condition: } -1 < ((A+BYD)-((A+BYD)^2-4AD(BY-CX))^{0.5})/(2AD) < ((A+BYD)+((A+BYD)^2-4AD(BY-CX))^{0.5})/(2AD) < 1 \quad (2)$$

when A>0,
and $$((A+BYD)-((A+BYD)^2-4AD(BY-CX))^{0.5})/(2AD) < 1 \quad (3)$$

when A<0,
where, the current value is a value positive in a direction in which the current is passed from the free layer, which is the ferromagnetic layer having a lower coercivity among the pair of ferromagnetic layers, toward the fixed layer. A and B satisfy $A=\alpha\gamma Hu$ and $B=\alpha\gamma$ respectively, where $\alpha$ is the Gilbert damping constant, $\gamma$ is the gyromagnetic ratio, and, Hu is the perpendicular component of the free layer magnetic field, which is the sum of a magnetocrystalline anisotropy field and a demagnetizing field of the free layer. C and D are given by $$C = \mu P/(Ms \times V \times e) \quad (4)$$

$$D = P^2 \quad (5)$$

when the intermediate layer is an insulating layer, where P is the spin polarization, 1.1 is the Bohr magneton, Ms is the saturation magnetization of the free layer, V is the volume of the free layer, and e is the electronic charge, and C and D are given by $$C = (\mu P/(Ms \times V \times e))/(-16 + 3(P^{1/2} + P^{-1/2})^3) \quad (6)$$

$$D = (P^{1/2} + P^{-1/2})^3/(-16 + 3(P^{1/2} + P^{-1/2})^3) \quad (7)$$

when the intermediate layer is a nonmagnetic (conducting) layer.

Further, in the driving step of the above-described driving method of this invention, the spin valve element can be driven without applying an external magnetic field, and the value X of the current can be made a value of X which satisfies both a third condition, obtained when Y=0 in the first condition, which is $$A^2 + 4ADCX > 0 \quad (8)$$

and a fourth condition, obtained when Y=0 in the second condition, which is, for A>0, $$-1 < (A - (A^2 + 4ADCX)^{0.5})/(2AD) < (A + (A^2 + 4ADCX)^{0.5})/(2AD) < 1 \quad (9)$$

and for A<0, $$(A - (A^2 + 4ADCX)^{0.5})/(2AD) < 1 \quad (10)$$

By means of any of the modes of the invention, a microwave oscillator element which can oscillate even when the external magnetic field is made weak can be realized using a spin valve element. Further, a method of driving a microwave oscillator element which can oscillate even when an external magnetic field is not applied, and such an oscillator element, can be obtained.

BRIEF DESCRIPTION OF THE DRAWINGS

FIG. 6 shows examples of calculation of precessional motion in Practical Example 1, while

EXPLANATION OF SYMBOLS

Best Mode for Carrying Out the Invention

Below, an embodiment of the invention is explained, referring as appropriate to the drawings. Major technical points of this invention are the discoveries that, when the magnetization direction of the fixed layer is perpendicular to the film plane, due to the effect of spin injected by the current, the magnetization of the free layer counterbalances the effective magnetic field (the local apparent magnetic field) created by an external magnetic field, the anisotropy magnetic field within the free layer, and the demagnetizing field perpendicular to the film plane, so that stable precessional motion can occur, and that, even when as a result the external magnetic field is weak, or even when no field is applied at all, microwave oscillation is possible due to a current alone.

First, the inventor of this application conducted theoretical analyses of phenomena occurring in current elements, and with respect to oscillation of spin valve elements, studied the external magnetic fields and driving currents for which oscillation occurred.

As one example illustrating the simplest case, a model is considered in which the anisotropy magnetic field is weak, and the external magnetic field and spin transfer current are dominant. Consequently only the second and third terms in the above-described equation (23) are considered, and settings are considered in which the direction of the external magnetic field causes the magnetization of the free layer to be directed so as to be antiparallel to, rather than parallel to, the magnetization of the fixed layer, and the spin transfer current direction is in the current direction causing the free layer magnetization to be directed parallel to, rather than antiparallel to, the magnetization of the fixed layer. Worth noting is that two settings for the spatial direction of the external magnetic field can be selected in these settings, and that the direction of the magnetization of the fixed layer must be set opposite the direction of the external magnetic field in each of these cases. That is, the first case is a case in which the external magnetic field has direction θ=0 and the fixed layer magnetization has direction θ=π, which are the same directions as in FIG. 12. The other, second case is a case in which the external magnetic field has direction θ=π and the fixed layer magnetization has direction θ=0, which are opposite to the field directions of FIG. 12. In either case, if the current is directed from the free layer toward the fixed layer (electrons directed from the fixed layer to the free layer), then seen in terms of operation, as explained above, the direction of the external magnetic field is such that the free layer magnetization is directed antiparallel to rather than parallel to the fixed layer magnetization, and the spin transfer current direction is a current direction such that the free layer magnetization is directed parallel to rather than antiparallel to the fixed layer magnetization (that is, electrons are directed from the fixed layer toward the free layer). In the following calculations, the settings for the second case (the case of θ=π) are employed, but equations are the same for the first case (the case of FIG. 12) as well.

Figure 1:
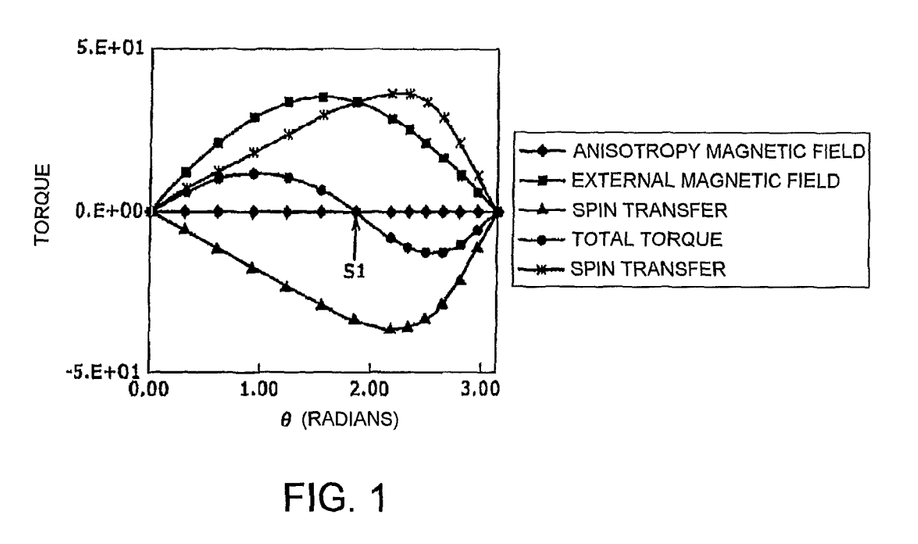
FIG. 1 is an explanatory diagram showing the θ dependence of the torque $T_\theta$ when the external magnetic field and the spin transfer current are dominant, in a GMR element.

Calculation of the θ dependence of the torque $T_\theta$ in this case, for the case of GMR, is as shown in FIG. 1. Here, the calculation conditions are an anisotropy magnetic field of 0 kA/m, external magnetic field of −100 A/m, and current of −50 μA. The sign of the torque $T_\theta$ is positive for a torque directed so as to direct the free layer magnetization from the z axis positive direction to the negative direction. The sign of the current is positive for a current direction so as to apply a torque directing the free layer magnetization from the z axis positive direction toward the negative direction (positive torque). In FIG. 1, values are shown with the polarity reversed for the spin transfer current term, so as to facilitate comparison of the effects of the external magnetic field and the spin transfer current. In the case of FIG. 1, the total torque $T_\theta$ acting on the free layer magnetization is zero near θ=1.88, as indicated by the point S1, and moreover satisfies equation (25), so that here stable precessional motion is obtained. In the case opposite that of FIG. 12, that is, when coordinate axes are chosen such that the positive z axis direction is aligned with the direction of magnetization of the fixed layer (perpendicularly to the film plane), the conditions of the above calculation are realized with the direction of the external magnetic field in the negative z axis direction and with the transfer current directed such that electrons flow from the fixed layer to the free layer, at which time the calculation result is also the same.

Figure 2:
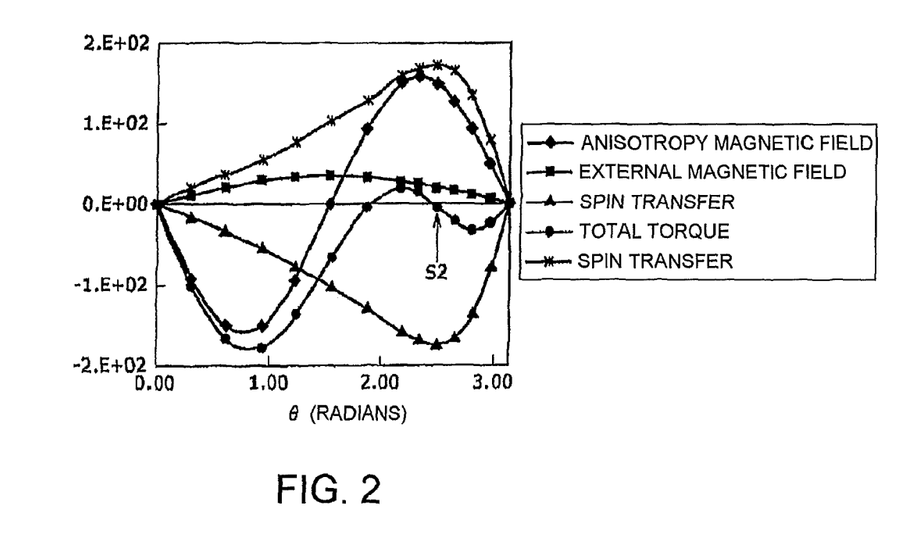
FIG. 2 is an explanatory diagram showing the θ dependence of the torque $T_\theta$ when the magnetocrystalline anisotropy field and the spin transfer current are dominant, in a TMR element.

In addition to the above, the inventor of this application also focused on the existence of a demagnetizing field which depends on the magnetocrystalline anisotropy field arising from the crystal anisotropy of the material of the free layer and on the film shape. An example of analysis of this case appears in FIG. 2. Here, when the anisotropy magnetic field is considered, the magnetocrystalline anisotropy field in the direction perpendicular to the film plane and the demagnetizing field act such that their effects on the torque cancel. Specifically, the magnetocrystalline anisotropy field is generated as a magnetic field causing the magnetization of the free layer to be directed in the direction perpendicular to the film plane (the positive or negative z axis direction) rather than in a direction within the film plane, but in contrast, the demagnetizing film is generated as a magnetic field causing the magnetization of the free layer to be directed in an in-plane direction of the film plane rather than in the direction perpendicular to the film plane (the positive or negative z axis direction). In the example of FIG. 2, trial calculations are performed for a case in which the magnetocrystalline anisotropy field is dominant compared with the demagnetizing field (anisotropy magnetic field>0). Here, the anisotropy magnetic field was 900 kA/m, the external magnetic field was −100 A/m, and the current was −40 μA. A stable point providing conditions to obtain a magnetization precessional motion exists near θ=2.5, as indicated by point S2, and it is seen that stable precision movement is possible. To explain this precessional motion intuitively, the torque arising from the spin transfer current to cause the free layer magnetization to be directed from the state antiparallel with the fixed layer magnetization to the parallel state can be understood to be counterbalanced by the torque causing direction from the parallel state to the antiparallel state, arising from the external magnetic field and from the anisotropy magnetic field favoring the perpendicular direction. When the demagnetizing field is dominant compared with the magnetocrystalline anisotropy field (anisotropy magnetic field<0), by reversing the polarity of the spin transfer current from that above and similar, the conditions at which the two torques are counterbalanced can be found. If an external magnetic field is given which is sufficiently greater than the anisotropy magnetic field, then the characteristics are similar to those of FIG. 1 showing an example of calculation of a weak anisotropy field for GMR.

Figure 3:
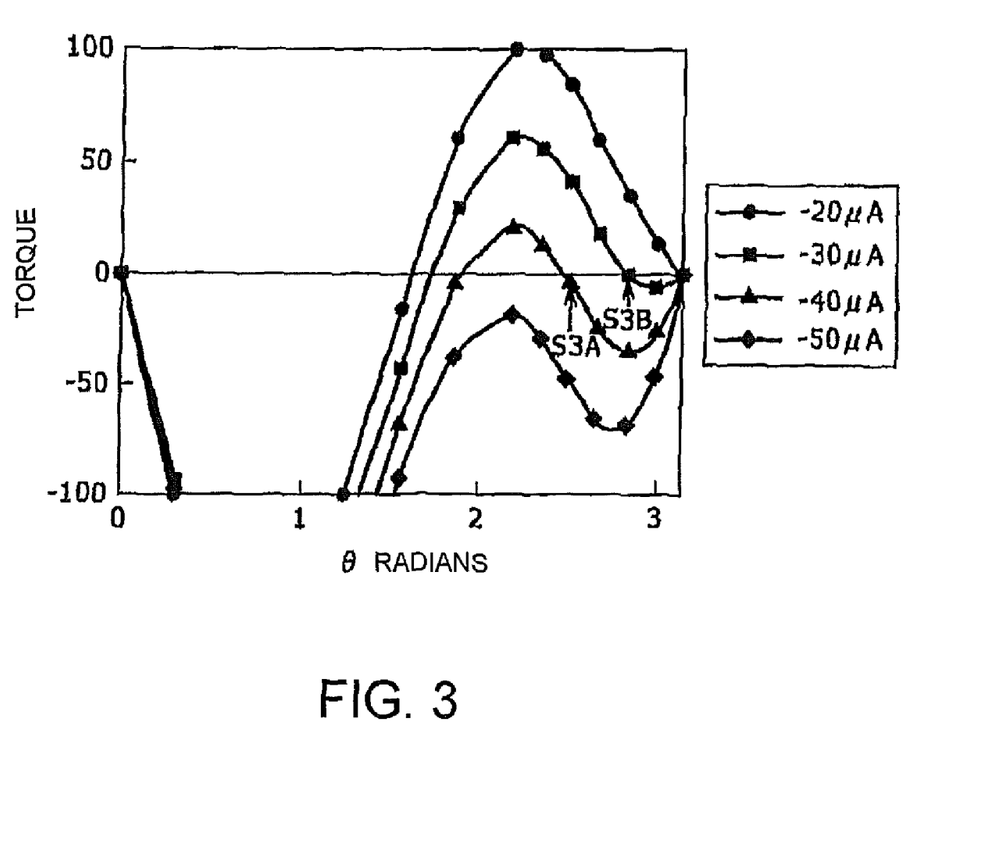
FIG. 3 is an explanatory diagram showing the influence on the θ dependence of the torque $T_\theta$ under the conditions of FIG. 2, with the current value as a parameter.

Next, a theoretical analysis of the results of FIG. 2 was further attempted with the conditions modified. FIG. 3 shows changes in $T_\theta$ near the angle at which oscillation is obtained, taking the transfer current as a parameter, when using an element in which, similarly to FIG. 2, the magnetocrystalline anisotropy field arising from the crystal anisotropy of the free layer material, the demagnetizing magnetic field depending on the film shape, an external magnetic field, and the transfer spin are all perpendicular to the free layer film plane, with 900 kA/m as the anisotropy magnetic field and −100 A/m as the external magnetic field. It is seen that in order to obtain the stabilised precessional motion necessary to obtain oscillation, the transfer current is limited to a specified range. Specifically, when the transfer current is −50 μA, a point at which equations (24) and (25) are both satisfied, that is, a point at which the value of the torque in the θ direction is 0 and a point having a downward-right tangent is not obtained in the region of θ greater than 0 and less than π. If the transfer current is −40 μA, then points satisfying such conditions exist near θ=2.5, as indicated by the point S3A, and so it is seen that at this point stable precessional motion is possible. The transfer current of −40 μA is the same as the calculation conditions for which the results of FIG. 2 were obtained. If the transfer current is −30 μA, then such points move in the vicinity of θ=2.85 as indicated by the point S3B, but stable precessional motion is still possible. However, if the transfer current is −20 μA, points satisfying such conditions are no longer observed.

Details of the above theoretical analysis are further explained. Theoretical characteristics may be analytically expressed as follows. That is, a general solution other than at θ=0, it to equation (23), that is, to $T_\theta = -\alpha\gamma Hu \sin\theta \cos\theta - \alpha\gamma H_{ext} \sin\theta + \beta_{ST}(\theta)I \sin(\theta) = 0$, is obtained by solving $$\alpha\gamma Hu \cos\theta + \alpha\gamma H_{ext} - \beta_{ST}(\theta)I = 0 \quad (26)$$

Upon substituting $\beta_{ST}(\theta) = C/(1+D\cos\theta)$ as the general form of $\beta_{ST}(\theta)$, and expressing equation (26) as $$A\cos\theta + BY - CX/(1+D\cos\theta) = 0 \quad (27)$$

(where $A = \alpha\gamma Hu$, $B = \alpha\gamma$, $X = I$, $Y = H_{ext}$), a second-order equation in cos θ results, and so $$\cos\theta = (-(A+BYD) \pm ((A+BYD)^2 - 4AD(BY-CX))^{0.5})/(2AD)$$

is obtained. That is, that equation (27) has a real solution in the range −1<cos θ<1 is a condition for obtaining oscillation. Specifically, $$(A+BYD)^2 - 4AD(BY-CX) > 0 \quad (28)$$

$$-1 < ((A+BYD) + ((A+BYD)^2 - 4AD(BY-CX))^{0.5})/(2AD) < 1 \quad (29)$$

$$-1 < ((A+BYD) - ((A+BYD)^2 - 4AD(BY-CX))^{0.5})/(2AD) < 1 \quad (30)$$

If X (=the transfer current I) and Y (=the external magnetic field $H_{ext}$) satisfying equations (28) to (30) are determined, the oscillation-enabled region is found.

Figure 4A:
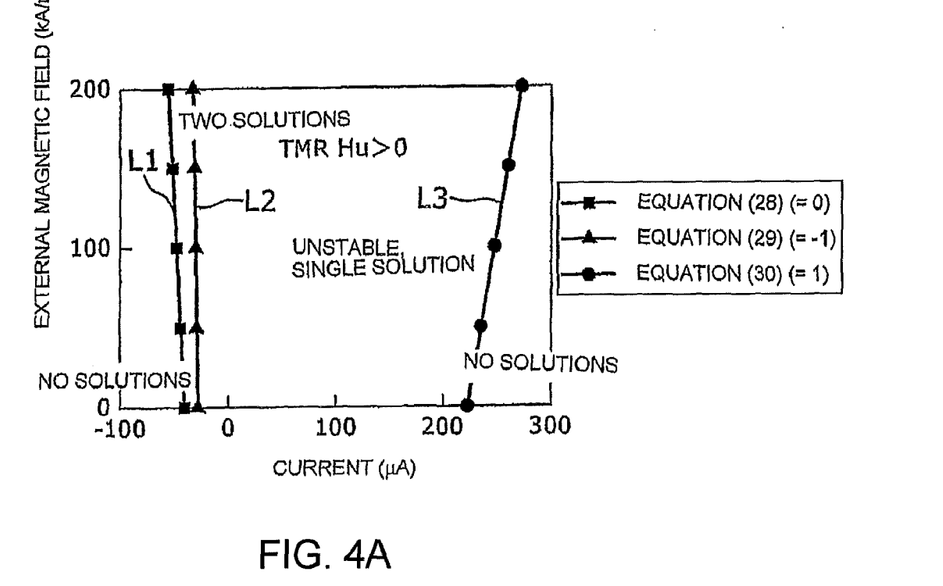
FIG. 4 is an example of calculation of the oscillation-enabled region of a perpendicular magnetization spin valve element.
Figure 4B:
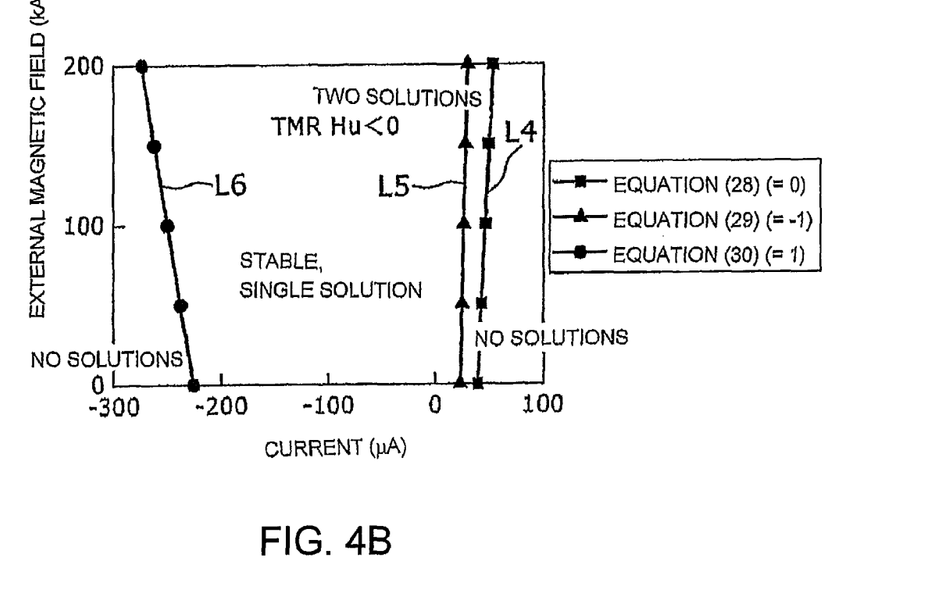

A specific calculation example, performed for the above analysis of a combination of currents and external magnetic fields, appears in FIGS. 4A and 4B. Examples of numerical calculations of equations (28) to (30) are shown FIG. 4A for a case in which the magnetocrystalline anisotropy field is dominant (anisotropy magnetic field>0), and FIG. 4B for a case in which the demagnetizing field is dominant (anisotropy magnetic field<0). For example, in FIG. 4A, equation (28) is satisfied on the right side of the curve L1, and the equations (29) and (30) are simultaneously satisfied on the left side of the curve L2, so that in the region between the curve L1 and the curve L2, there exist two real solutions for $\cos\theta$ other than $\theta=0, \pi$. This is the condition equivalent to FIG. 2. On the right side of the curve L2 the equation (30) is no longer satisfied, and there is one real solution for $\cos\theta$; this is equivalent for example to the case of a current of $-20\,\mu A$ in FIG. 3, and equation (25) is not satisfied, so that stable precessional motion is not realized. On the right side of the curve L3 the equation (29) is also no longer satisfied, and there exist no real solutions for $\cos\theta$. In this way, when the magnetocrystalline anisotropy field is dominant (anisotropy magnetic field>0), that is, when A>0, the condition for obtaining stable precessional motion is the region between the curve L1 and the curve L2, that is, the following condition.

$$(A+BYD)^2-4AD(BY-CX)>0 \quad (1)$$

and $$-1<((A+BYD)-((A+BYD)^2-4AD(BY-CX))^{0.5})/(2AD)<((A+BYD)+((A+BYD)^2-4AD(BY-CX))^{0.5})/(2AD)<1 \quad (2)$$

On the other hand, in FIG. 4B, equation (28) is satisfied on the left side of the curve L4, and equations (29) and (30) are simultaneously satisfied on the right side of the curve L5, so that in the region between the curve L4 and the curve L5, there exist two real solutions for $\cos\theta$. On the left side of the curve L5 equation (29) is no longer satisfied, and there is one real solution for $\cos\theta$, but in this case equation (25) is satisfied, so that stable precessional motion is realized. On the left side of the curve L6 equation (29) is no longer satisfied, and there no longer exist any real solutions for $\cos\theta$. In this way, when the demagnetizing field is dominant (anisotropy magnetic field<0), that is, when A<0, the condition for obtaining stable precessional motion is the region between the curve L5 and the curve L6, that is, the following condition.

$$(A+BYD)^2-4AD(BY-CX)>0 \quad (1)$$

and $$((A+BYD)-((A+BYD)^2-4AD(BY-CX))^{0.5})/(2AD)<1 \quad (3)$$

The same equation numbers are used for equations with the same contents.

FIG. 4 is a exemplary calculation using specific values for the saturation magnetization of the free layer, anisotropy magnetic field, volume of free layer, and similar; however, the conditions obtained through the above-described analysis have a generality which enables application to general cases in which arbitrary values are used for these values. The parameters and principal physical constants used in calculations appear in Table 1.

TABLE 1

| Symbol | Quantity | Units | Numerical value |
|---|---|---|---|
| α | Damping constant | — | 0.01 |
| P | Polarization (TMR) | — | 0.9 |
| P | Polarization (GMR) | — | 0.35 |
| V | Volume of free layer | m³ | 1.4E−23 |
| I | Current | A | Calculation parameter |

TABLE 1-continued

| Symbol | Quantity | Units | Numerical value |
|---|---|---|---|
| Hext | External magnetic field | A/m | Calculation parameter |
| Hu | magnetocrystalline anisotropy field | A/m | ±9.E+05 |
| Ms | of free layer | T | 1.79 |
| γ | Gyromagnetic ratio | Hz/(A/m) | 3.5E+04 |
| $\mu_B$ | Bohr magneton | J/T | 9.3E−24 |
| e | Electronic charge | C | 1.6E−19 |

Figure 5:
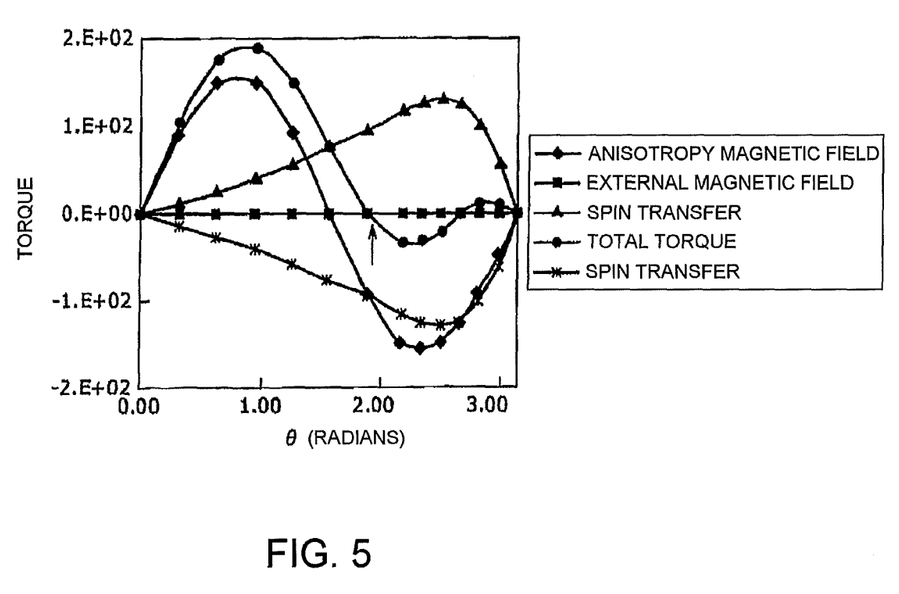
FIG. 5 is an explanatory diagram showing the θ dependence of the torque $T_\theta$ when the magnetocrystalline anisotropy field and the spin transfer current are dominant, in a TMR element of the invention (anisotropy magnetic field −900 kA/m, external magnetic field 0 A/m, current 30 μA)

From this analysis it has become clear that, even when the external magnetic field is made zero in the above analysis, there exist current conditions which satisfy the oscillation conditions. That is, upon setting Y=0 in equations (28) to (30), $$A^2+4ADCX>0 \quad (31)$$

$$-1<(A+(A^2+4ADCX)^{0.5})/(2AD)<1 \quad (32)$$

$$-1<(A-(A^2+4ADCX)^{0.5})/(2AD)<1 \quad (33)$$

are obtained. From considerations similar to those above, if the value X of the current flowing in the spin valve element is within the range below, a stable precessional motion is realized, and microwave oscillation is possible. That is, when $$A^2+4ADCX>0 \quad (8)$$

for a value X of the current such that when A>0, $$-1<(A-(A^2+4ADCX)^{0.5})/(2AD)<(A+(A^2+4ADCX)^{0.5})/(2AD)<1 \quad (9)$$

is satisfied, and when A<0, $$(A-(A^2+4ADCX)^{0.5})/(2AD)<1 \quad (10)$$

is satisfied, microwave oscillation is possible. In particular, FIG. 5 shows an example of the $\theta$ dependence of the torque $T_\theta$ for a case in which A<0. It is seen that the demagnetizing field has the property of causing the free layer magnetization to be directed in a direction within the film plane rather than a direction perpendicular to the film plane (the positive or negative z axis direction), but is counterbalanced by the spin transfer current, so that a stable precessional motion is possible.

The above calculations were for an element in which the magnetocrystalline anisotropy field arising from the crystal anisotropy of the free layer material, the demagnetizing field dependent on the film shape, the external magnetic field, and the transfer spin are all perpendicular to the plane of the free layer film. The demagnetizing field in a thin film is essentially in the direction perpendicular to the film plane, and so conforms to the premises of the above trial calculations. And because the magnetization of the fixed layer is perpendicular to the film plane, the transfer spin is also perpendicular to the film plane. On the other hand, the magnetocrystalline anisotropy field can be either perpendicular to or parallel to the film plane, according to the type of ferromagnetic material and the method of manufacture. However, in normally used free layers, the material and structure enable easy magnetization reversal, so that the magnetocrystalline anisotropy field is sufficiently small for practical purposes, and equations (28) to (30) obtain a good approximation.

In the above exemplary calculations, TMR examples were mainly used, but clearly similar conclusions can be obtained for the case of GMR as well.

However, from the example of FIG. 2 for instance, when there exist two real solutions for $\cos\theta$ satisfying equation (24)

other than θ=0, π, when a current equivalent to a microwave oscillation state is passed through the spin valve element, the total torque is a positive value for θ in the range from approximately 1.8 to 2.5, and is a negative value in the range of approximately 2.5 to 3.14. For this reason, if the initial-state θ is at a position in the range from approximately 1.8 to 3.14, the magnetization smoothly transitions to an oscillation state (near θ=2.5). On the other hand, if the initial-state θ is approximately 1.8 or below, the magnetization transitions to the position of θ=0 and an oscillation state is not reached. This means that, in circumstances in which whether microwave oscillation can or cannot be obtained is not constant, whether microwave oscillation is enabled or not can be controlled through the initial state. As the specific means for this, when A>0, it is effective to make the torque positive in the range 0 to π and to perform initialization at θ=π. The torque is positive for θ in the range from 0 to π in the region on the left of the curve L1 in FIG. 4A. That is, in the initial driving period, initialization can be performed by passing a current satisfying equation (11) below through the spin valve element.

$$1 < ((A+BYD) + ((A+BYD)^2 - 4AD(BY-CX))^{0.5})/(2AD) \quad (11)$$

Further, when A<0, for example in FIG. 5 a state close to θ=π can be transitioned to θ=1.8 or less. This is equivalent to transitioning to the left side of the curve L5 in FIG. 4B. That is, when A<0, in the initial driving period, initialization can be performed by passing a current satisfying equation (12) below through the spin valve element.

$$((A+BYD) + ((A+BYD)^2 - 4AD(BY-CX))^{0.5})/(2AD) < -1 \quad (12)$$

As the materials comprised by a spin valve element using a driving method of this invention, silicon substrate or glass substrate can be used as the substrate 5, and copper substrate, which functions effectively as a heat sink, can also be used; these can be cooled as necessary by water cooling or another method. As the electrode layers 21, 29, 31, Ta, Pt, Cu, Au, Ag, Al, or Mo, as the antiferromagnetic layer 22 IrMn or PtMn, and as the ferromagnetic layer 23 (fixed layer) CoCrTa, CoCrPt, TbFe, TbFeCo, GdFe, and GdCo are appropriate; as the insulating layer 24, MgO, Al oxides, as the nonmagnetic (conducting) layer 51 Cu, and as the ferromagnetic layer 25 (free layer), generally in addition to CoFe and CoFeB, materials in which perpendicular anisotropy can easily be obtained such as TbFe, TbFeCo, GdFe, GdFeCo, and similar, and NiFe with a small crystal anisotropy, are appropriate; but materials used as not limited to these. As the capping layer 27, Cu and Pd are representative examples, but materials are not limited to these. Moreover, the materials of the ferromagnetic layer 23 (fixed layer) and the ferromagnetic layer 25 (free layer) are often made the same, with the film thickness of the former made greater than the film thickness of the latter to add a coercive force difference, to cause spin valve functions. After layering these, magnetic field annealing is effective to adjust the crystallinity of each of the layers and the magnetic anisotropy of the fixed layer. Also, the ferromagnetic layer 23 (fixed layer) can be made an antiferromagnetic coupled film such as CoFeB/Ru/CoFeB or similar as necessary.

In this way, means can be provided for obtaining microwave oscillation through driving of a spin valve element using only the current. Below, practical examples actually obtained in the above embodiment are explained.

Practical Example 1

A TMR type spin valve element was manufactured by the following means. That is, on a silicon substrate 5 with an oxide film 10 nm in thickness, a Cu (30 nm) thin film was formed as an electrode layer 21. Then, CoCrTa (20 nm) as the ferromagnetic layer 23, MgO (0.6 nm) as the insulating layer 24, NiFe (21 nm) as the ferromagnetic layer 25, CoFe (2 nm), Cu (0.6 nm), and CoFe (20 nm) as sensing layers, and Cu (2 nm) as the capping layer 26, were layered in order. Further, a negative resist was applied and was patterned by electron beam irradiation, and ion milling was performed to form 50 spin valve elements with a 100 nm×100 nm round columnar shape. A CVD method was used to form an SiO$_2$ film, after which the resist on the spin valve elements was removed by lift-off, and after forming the upper electrode, annealing was performed at 350° C. in a magnetic field of approximately 4 kOe, to obtain a sample of Practical Example 1. In this annealing, the magnetization of the ferromagnetic layer 23 (fixed layer) was directed so as to be perpendicular to the film plane (hereafter called a "perpendicular magnetic field").

Practical Example 2

A TMR type spin valve element was manufactured by the following means. That is, on a silicon substrate 5 with an oxide film 10 nm in thickness, a Cn (30 nm) thin film was formed as an electrode layer 21. Then, TbFeCo (20 nm) as the ferromagnetic layer 23, MgO (0.6 nm) as the insulating layer 24, GdFeCo (2 nm) as the ferromagnetic layer 25, CoFe (2 nm), Cu (0.6 nm), and CoFe (20 nm) as sensing layers, and Cu (2 nm) as the capping layer 26, were layered in order. Further, a negative resist was applied and was patterned by electron beam irradiation, and ion milling was performed to form 50 spin valve elements with a 100 nm×100 nm round columnar shape. A CVD method was used to form an SiO$_2$ film, after which the resist on the spin valve elements was removed by lift-off, and after forming the upper electrode, annealing was performed at 350° C. in a magnetic field of approximately 4 kOe, to obtain a sample of Practical Example 2.

Practical Example 3

A GMR type spin valve element was manufactured by the following means. That is, on a silicon substrate 5 with an oxide film 10 nm in thickness, a Cu (30 nm) thin film was formed as an electrode layer 21. Then, CoCrTa (20 nm) as the ferromagnetic layer 23, Cu (0.6 nm) as the nonmagnetic (conducting) layer 51, NiFe (2 nm) as the ferromagnetic layer 25, CoFe (2 nm), Cu (0.6 nm), and CoFe (20 nm) as sensing layers, and Cu (2 nm) as the capping layer 26, were layered in order. Further, a negative resist was applied and was patterned by electron beam irradiation, and ion milling was performed to form 50 spin valve elements with a 100 nm×100 nm round columnar shape. A CVD method was used to form an SiO$_2$ film, after which the resist on the spin valve elements was removed by lift-off, and after forming the upper electrode, annealing was performed at 250° C. in a magnetic field of approximately 4 kOe, to obtain a sample of Practical Example 3.

The elements of these Practical Examples 1 to 3 were tested by passing currents under the following conditions. Averages of the measurement results for 50 elements appear in Table 2, and calculated results appear in FIG. 6 to FIG. 9.

TABLE 2

| | Free layer material | Saturation magnetization (T) | Anisotropy magnetic field (kA/m) | Voltage (V) | Current (A) | Input (W) | Microwave output (W) |
|---|---|---|---|---|---|---|---|
| Practical Example 1 | NiFe | 0.86 | −684 | 1.3E−02 | 1.0E−05 | 1.3E−07 | 8.0E−11 |
| Practical Example 2 | GdFeCo | 0.13 | 180 | −6.0E−04 | −4.7E−07 | 2.8E−10 | 4.2E−14 |
| Practical Example 3 | NiFe | 0.86 | −684 | 4.6E−04 | 4.0E−05 | 1.8E−08 | 1.7E−11 |

Figure 6A:
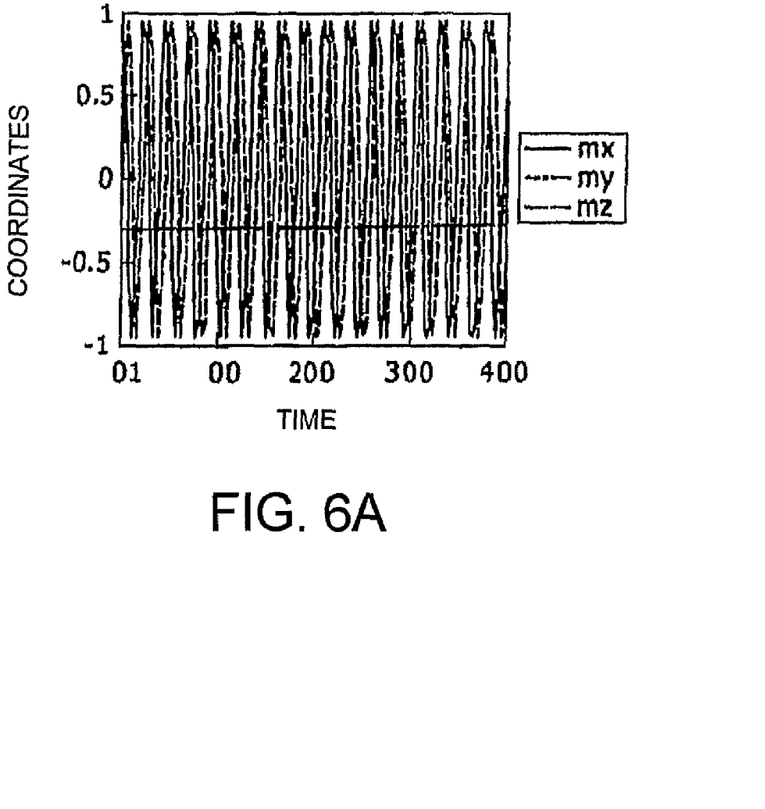
FIG. 6*a* shows changes with time in magnetization unit vectors, where $m_x$, $m_y$, $m_z$ are the vector components in the x axis, y axis, and z axis directions respectively.
Figure 6B:
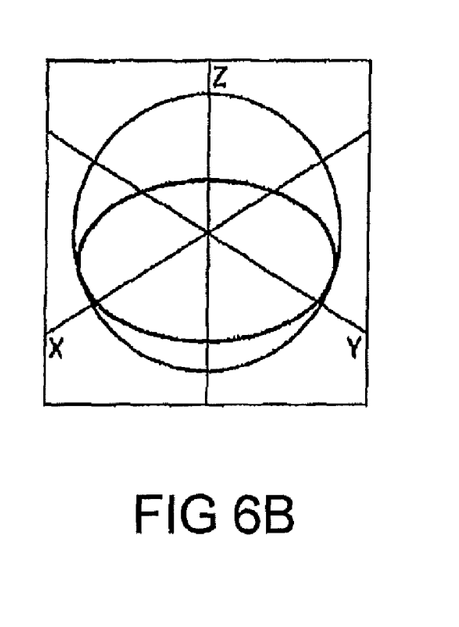
FIG. 6*b* is an explanatory diagram showing the locus of the magnetization unit vector.
Figure 7:
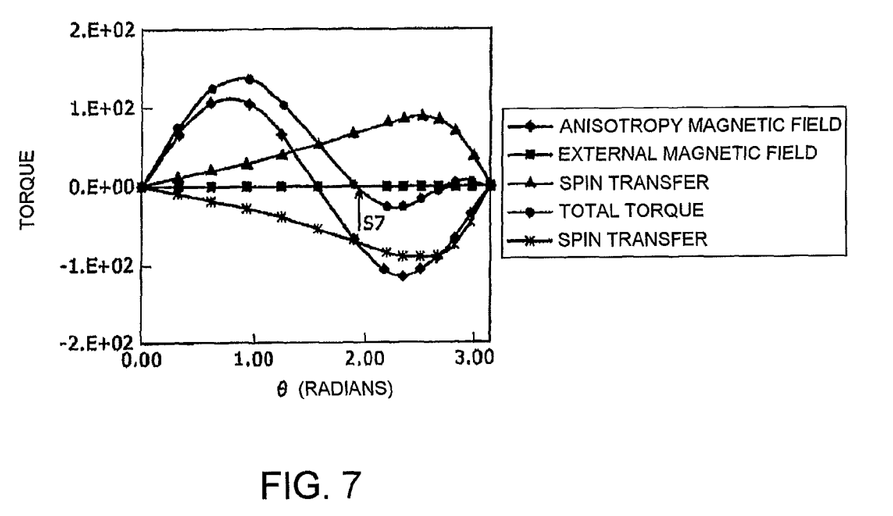
FIG. 7 is a characteristic diagram showing the θ dependence of the torque $T_\theta$ in Practical Example 1.
Figure 8:
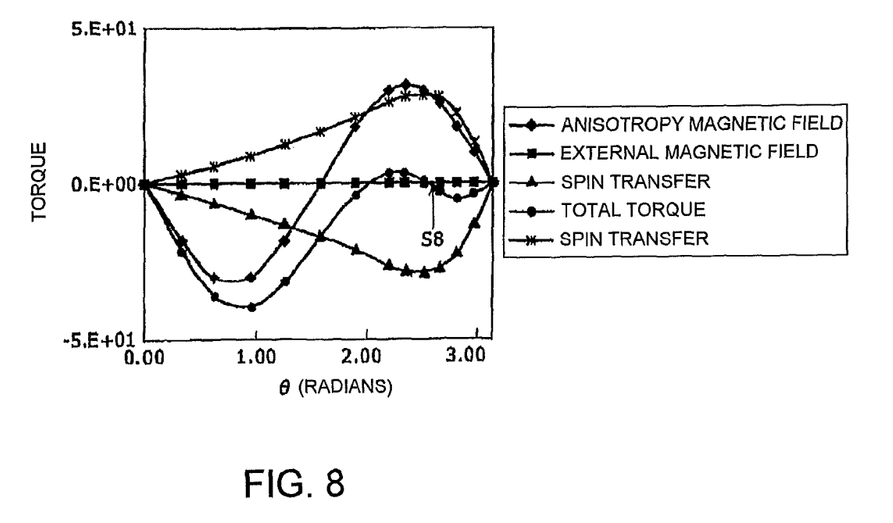
FIG. 8 is a characteristic diagram showing the θ dependence of the torque $T_\theta$ in Practical Example 2.
Figure 9:
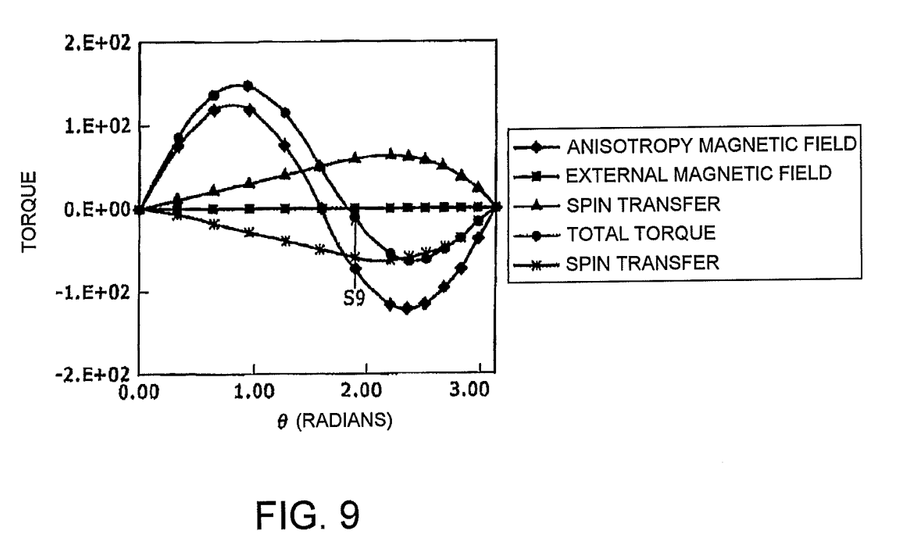
FIG. 9 is a characteristic diagram showing the θ dependence of the torque $T_\theta$ in Practical Example 3.

Of these, FIG. 6 shows the results of numerical analysis by the fourth-order Runge-Kutta method of the LLG equation of equation (14), for the conditions of Practical Example 1; it is seen that a stable precessional motion occurs in coordinates corresponding to $T_\theta$=1.88 (point S7) obtained in FIG. 7. However, the time on the horizontal axis in FIG. 7 is normalized by $(\gamma Ms)^{-1}$ (where $\gamma$ is the gyromagnetic ratio and Ms is the saturation magnetization), and the time unit is equivalent to approximately 42 psec. Although not shown in the drawings, similar results were obtained for Practical Examples 2 and 3 as well. From FIG. 7 to FIG. 9, it is clear that the conditions of Practical Examples 1 to 3 satisfy the conditions of equations (8) to (10). FIG. 8 and FIG. 9 show positions of $\theta$ at which a stable precessional motion is realized using points S8 and S9. Further, in measurements of the elements of Practical Examples 1 to 3, the numbers of elements undergoing oscillation among the 50 samples when a current shown in Table 1 was applied immediately after element manufacture were respectively 42, 17, and 50 elements. Next, upon applying currents of −5 μA and 5 μA to the samples of Practical Examples 1 and 2 respectively for one second and performing similar measurements, oscillation was observed in 50 of the 50 elements for the samples of both the practical examples. These current values satisfied equation (12) and equation (11). As is clear from these results and from the results of Table 1, by means of this invention, stable microwave output was obtained through current driving alone, without applying an external magnetic field.

From the above, through this invention it was possible to provide means of obtaining microwave oscillation by current-only driving of a spin valve element. An embodiment of the invention has been explained, but the invention is not limited to the above-described embodiment, and various modifications, alterations, and combinations are possible based on the technical concepts of the invention. For example, a step or means of adjusting the current so as to satisfy prescribed oscillation conditions can be provided, to obtain stabilised oscillation signals when an external magnetic field is not applied. The required means for adjusting the current can use any arbitrary current control mechanism or limiting mechanism.

The invention claimed is:

1. A spin valve element driving method for obtaining an electromagnetic signal from a spin valve element, the spin valve element including an intermediate layer, which is an insulating layer or an electrically conductive nonmagnetic layer, and a pair of ferromagnetic layers including a fixed layer and a free layer sandwiching the intermediate layer, the fixed layer having a higher coercivity than the free layer, and being magnetized in a direction substantially perpendicular to a film plane thereof,
the method comprising a driving step of passing current from one of the pair of ferromagnetic layers to the other through the intermediate layer, wherein
in the driving step, an amount X of the current and the value Y of a magnitude of an external magnetic field satisfy both
a first condition:

$$(A+BYD)^2-4AD(BY-CX)>0$$

and
a second condition:

$$-1<((A+BYD)-((A+BYD)^2-4AD(BY-CX))^{0.5})/(2AD)<((A+BYD)+((A+BYD)^2-4AD(BY-CX))^{0.5})/(2AD)<1$$

when A>0; and $$((A+BYD)-((A+BYD)^2-4AD(BY-CX))^{0.5})/(2AD)<1$$

when A<0, where
X is positive when the current passes from the free layer toward the fixed layer,
A=αγHu and B=αγ, α being the Gilbert damping constant, γ being the gyromagnetic ratio, and Hu being the component of the magnetic field, which is the sum of a magnetocrystalline anisotropy field crystal anisotropy magnetic field and a demagnetizing field of the free layer, perpendicular to the free layer, and C=μP/(Ms×V×e) and D=P² if the intermediate layer is an insulating layer, and C=(μP/(Ms×V×e))/(−16+3 $(P^{1/2}+P^{-1/2})^3$) and D=$(P^{1/2}+P^{-1/2})^3$/(−16+3($P^{1/2}+P^{-1/2})^3$) if the intermediate layer is an electrically conductive nonmagnetic layer, P being a spin polarization, μ being a Bohr magneton, Ms being a saturation magnetization of the free layer, V being a volume of the free layer, and e being an electronic charge.

2. The spin valve element driving method according to claim 1, wherein the driving step includes driving the spin valve element without applying an external magnetic field, where the current X passing therethrough, satisfies both
a third condition:

$$A^2+4ADCX>0$$

and a fourth condition:

$$-1<(A-(A^2+4ADCX)^{0.5})/(2AD)<(A+(A^2+4ADCX)^{0.5})/(2AD)<1,$$

when A>0, and $$(A-(A^2+4ADCX)^{0.5})/(2AD)<1,$$

when A<0.

3. The spin valve element driving method according to claim 1, further comprising passing a current through the spin valve element for a prescribed time prior to the driving step, the amount X of the current satisfying $$1<((A+BYD)+((A+BYD)^2-4AD(BY-CX))^{0.5})/(2AD),$$

where A>0.

4. The spin valve element driving method according to claim 1, further comprising passing a current through the spin valve element for a prescribed time prior to the driving step, the amount X of the current satisfying $$((A+BYD)+((A+BYD)^2-4AD(BY-CX))^{0.5})/(2AD)<-1,$$

where $A<0$.

5. A spin valve element, comprising:
an intermediate layer, which is an insulating layer or an electrically conductive nonmagnetic layer; and
a pair of ferromagnetic layers including a fixed layer and a free layer sandwiching the intermediate layer, the fixed layer having a higher coercivity than the free layer, such that an electromagnetic signal is obtained when a current passes from one of the ferromagnetic layers to the other through the intermediate layer during which
the fixed layer is magnetized in a direction substantially perpendicular to a film plane of the fixed layer, and
for the free layer, an amount X of the current and the value Y of a magnitude of an external magnetic field satisfy both
a first condition:

$$(A+BYD)^2-4AD(BY-CX)>0$$

and
a second condition:

$$-1<((A+BYD)-((A+BYD)^2-4AD(BY-CX))^{0.5})/(2AD)<((A+BYD)+((A+BYD)^2-4AD(BY-CX))^{0.5})/(2AD)<1$$

when $A>0$; and $$((A+BYD)-((A+BYD)^2-4AD(BY-CX))^{0.5})/(2AD)<1$$

when $A<0$, where
X is positive when the current passes from the free layer toward the fixed layer,
$A=\alpha\gamma Hu$ and $B=\alpha\gamma$, $\alpha$ being the Gilbert damping constant, $\gamma$ being the gyromagnetic ratio, and Hu being the component of the magnetic field, which is the sum of a magnetocrystalline anisotropy field crystal anisotropy magnetic field and a demagnetizing field of the free layer, perpendicular to the free layer, and
$C=\mu P/(Ms\times V\times e)$ and $D=P^2$ if the intermediate layer is an insulating layer, and $C=(\mu P/(Ms\times V\times e))/(-16+3(P^{1/2}+P^{-1/2})^3)$ and $D=(P^{1/2}+P^{-1/2})^3/(-16+3(P^{1/2}+P^{-1/2})^3)$ if the intermediate layer is an electrically conductive nonmagnetic layer, P being a spin polarization, $\mu$ being a Bohr magneton, Ms being a saturation magnetization of the free layer, V being a volume of the free layer, and e being an electronic charge.

6. The spin valve element according to claim 5, wherein when the current passes from one to the other of the ferromagnetic layers,
an external magnetic field is not applied, and
in the free layer, the amount X of the current passing therethrough satisfies both
a third condition:

$$A^2+4ADCX>0$$

and
a fourth condition:

$$-1<(A-(A^2+4ADCX)^{0.5})/(2AD)<(A+(A^2+4ADCX)^{0.5})/(2AD)<1,$$

when $A>0$; and $$(A-(A^2+4ADCX)^{0.5})/(2AD)<1,$$

when $A<0$.

7. A spin valve element driving method for obtaining an electromagnetic signal from a spin valve element, the spin valve element including an intermediate layer, and a pair of ferromagnetic layers including a fixed layer and a free layer sandwiching the intermediate layer, the fixed layer having a higher coercivity than the free layer, and being magnetized in a direction substantially perpendicular to a film plane thereof, the method comprising a driving step of passing current from one of the pair of ferromagnetic layers to the other through the intermediate layer, without applying an external magnetic field to the free layer, the free layer exhibiting a saturation magnetization and anisotropy magnetic field for which in the driving step, the current passing in the spin valve element can take on a value satisfying a prescribed oscillation condition.

8. A spin valve element, comprising:
an intermediate layer; and
a pair of ferromagnetic layers including a fixed layer and a free layer sandwiching the intermediate layer, the fixed layer having a higher coercivity than the free layer, such that an electromagnetic signal is obtained when a current passes from one of the ferromagnetic layers to the other through the intermediate layer, the fixed layer, being magnetized in a direction substantially perpendicular to a film plane of the fixed layer, and the free layer exhibiting a saturation magnetization and anisotropy magnetic field for which the current passing in the spin valve element can take on a value satisfying a prescribed oscillation condition.

9. The spin valve element driving method of claim 7, further comprising, in the driving step, adjusting the current for driving the spin valve element to satisfy the prescribed oscillation condition.

10. The spin valve element of claim 8, further comprising current adjustment means, connected to at least one of the fixed layer and the free layer, for setting the current for driving the spin valve element to the prescribed oscillation condition.

11. The spin valve element of claim 8, wherein the intermediate layer is an insulating layer or an electrically conductive nonmagnetic layer.

* * * * *